(12) United States Patent
Funahashi

(10) Patent No.: US 10,958,231 B2
(45) Date of Patent: Mar. 23, 2021

(54) SURFACE ACOUSTIC WAVE DEVICE, HIGH-FREQUENCY MODULE, AND METHOD OF FABRICATING SURFACE ACOUSTIC WAVE DEVICE

(71) Applicant: Murata Manufacturing Co., Ltd., Nagaokakyo (JP)

(72) Inventor: Kentaro Funahashi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 679 days.

(21) Appl. No.: 15/814,439

(22) Filed: Nov. 16, 2017

(65) Prior Publication Data

US 2018/0076786 A1 Mar. 15, 2018

Related U.S. Application Data

(63) Continuation of application No. PCT/JP2016/062686, filed on Apr. 21, 2016.

(30) Foreign Application Priority Data

May 18, 2015 (JP) .............................. JP2015-101308

(51) Int. Cl.
*H03H 3/08* (2006.01)
*H03H 9/05* (2006.01)
(Continued)

(52) U.S. Cl.
CPC .......... *H03H 3/08* (2013.01); *H03H 9/02535* (2013.01); *H03H 9/058* (2013.01); *H03H 9/25* (2013.01)

(58) Field of Classification Search
CPC combination set(s) only.
See application file for complete search history.

(56) References Cited

U.S. PATENT DOCUMENTS

| 2006/0131998 A1* | 6/2006 | Aoki | .................... H03H 9/1092 |
| | | | 310/340 |
| 2009/0001849 A1* | 1/2009 | Tsuda | ................... H03H 9/0547 |
| | | | 310/313 R |

(Continued)

FOREIGN PATENT DOCUMENTS

| JP | 2000-261284 A | 9/2000 |
| JP | 2008-130932 A | 6/2008 |

(Continued)

OTHER PUBLICATIONS

Official Communication issued in International Patent Application No. PCT/JP2016/062686, dated Jul. 19, 2016.

*Primary Examiner* — Bryan P Gordon
(74) *Attorney, Agent, or Firm* — Keating & Bennett, LLP

(57) ABSTRACT

A surface acoustic wave device includes a piezoelectric substrate, an IDT electrode, a support layer, a cover layer, and a pillar-shaped electrode. The IDT electrode is provided on a main surface of the piezoelectric substrate. The support layer is disposed around a region where the IDT electrode is provided and has a larger height from the main surfaces than a height of the IDT electrode therefrom. The cover layer is disposed on the support layer and covers the IDT electrode. The pillar-shaped electrode is located on one of the main surfaces where the pillar-shaped electrode is in contact with the support layer. The pillar-shaped electrode is electrically connected to the IDT electrode. The pillar-shaped electrode includes a top surface and a side surface. Each of the top surface and the side surface includes a portion exposed to outside.

11 Claims, 4 Drawing Sheets

(51) Int. Cl.
*H03H 9/25* (2006.01)
*H03H 9/02* (2006.01)

(56) References Cited

U.S. PATENT DOCUMENTS

| | | | |
|---|---|---|---|
| 2009/0051245 | A1 | 2/2009 | Takayama et al. |
| 2010/0043189 | A1* | 2/2010 | Fukano .................. H05K 1/144 29/25.35 |
| 2010/0117483 | A1* | 5/2010 | Tanaka ............... H03H 9/02992 310/313 B |
| 2010/0225202 | A1 | 9/2010 | Fukano et al. |
| 2010/0301708 | A1 | 12/2010 | Tsuda |
| 2011/0084573 | A1* | 4/2011 | Yamaji ................ H03H 9/1092 310/340 |
| 2011/0234055 | A1* | 9/2011 | Fukano .................. H03H 9/059 310/365 |
| 2012/0032759 | A1* | 2/2012 | Nishii .................. H03H 9/6433 333/193 |
| 2012/0194033 | A1* | 8/2012 | Tsuda ....................... H03H 9/64 310/313 C |
| 2014/0151108 | A1 | 6/2014 | Mikami et al. |
| 2015/0194948 | A1* | 7/2015 | Inate ....................... H03H 3/08 333/133 |

FOREIGN PATENT DOCUMENTS

| | | |
|---|---|---|
| JP | 2011-147097 A | 7/2011 |
| JP | 2012-209662 A | 10/2012 |
| JP | 2013-048489 A | 3/2013 |
| JP | 2014-110370 A | 6/2014 |
| JP | 2015-012428 A | 1/2015 |
| WO | 2006/106831 A1 | 10/2006 |

\* cited by examiner

Comparative Example

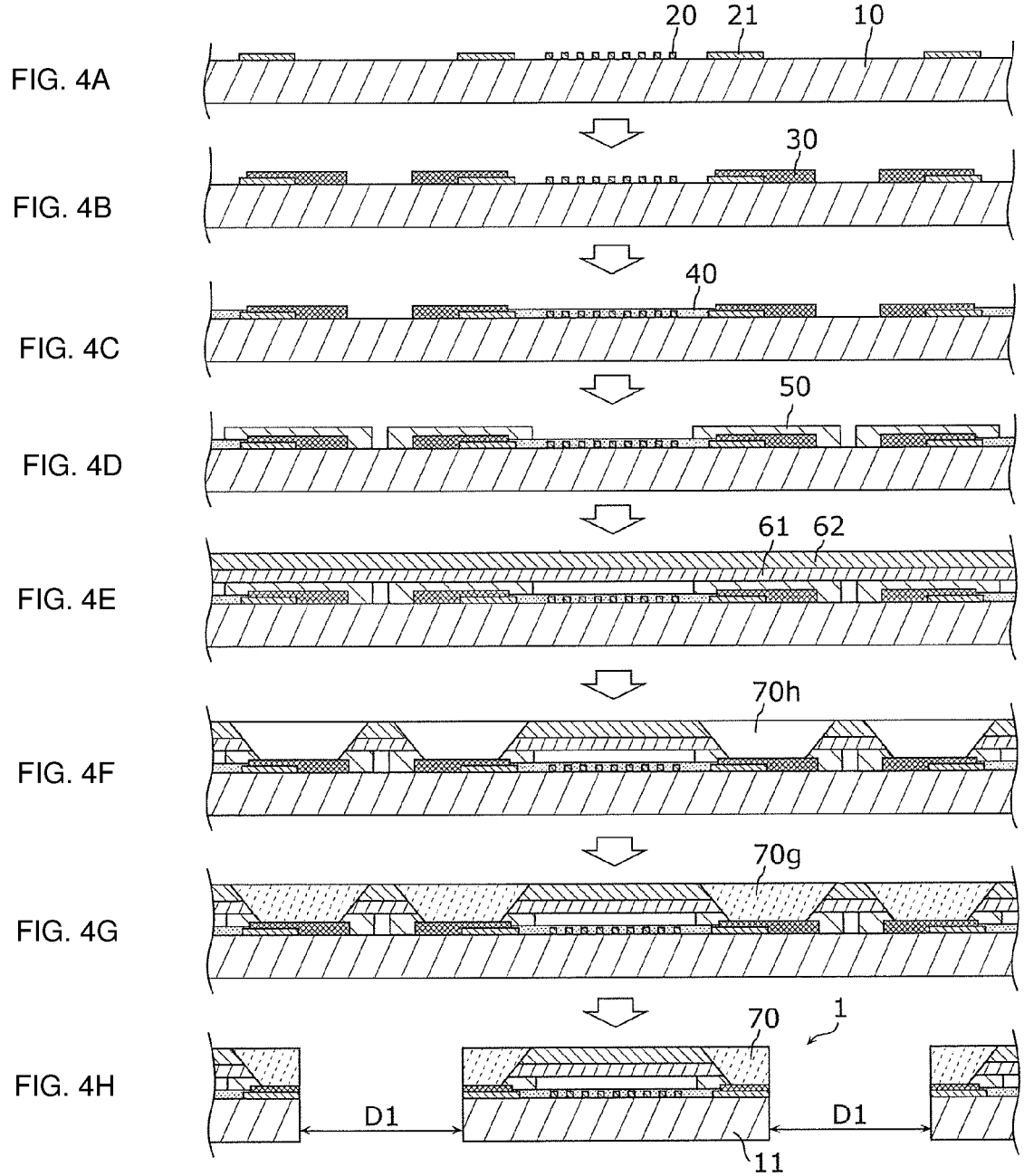

SURFACE ACOUSTIC WAVE DEVICE, HIGH-FREQUENCY MODULE, AND METHOD OF FABRICATING SURFACE ACOUSTIC WAVE DEVICE

CROSS REFERENCE TO RELATED APPLICATIONS

This application claims the benefit of priority to Japanese Patent Application No. 2015-101308 filed on May 18, 2015 and is a Continuation Application of PCT Application No. PCT/JP2016/062686 filed on Apr. 21, 2016. The entire contents of each application are hereby incorporated herein by reference.

BACKGROUND OF THE INVENTION

1. Field of the Invention

The present invention relates to a surface acoustic wave device that vibrates a surface acoustic wave using an electrode provided on a piezoelectric substrate, and to a high-frequency module and a method of fabricating the surface acoustic wave device.

2. Description of the Related Art

Nowadays, surface acoustic wave devices are used as band-pass filters used in RF (radio frequency) circuits of communication devices and other devices. In the field of communication devices, such as cellular phones, there exist needs to decrease the size and thickness of the devices. Accordingly, there have been efforts to decrease the size and height of components, such as surface acoustic wave devices. As a packaging structure to decrease the size and height of surface acoustic wave devices, a WLP (wafer level package) structure has been proposed, for example, in Japanese Unexamined Patent Application Publication No. 2011-147097. In the WLP structure, a piezoelectric substrate itself is used as a portion of the package, and the packaging structure is fabricated in a wafer state. When a surface acoustic wave device having a WLP structure is mounted on a mounting board, IDT (inter digital transducer) electrodes provided on a main surface of the piezoelectric substrate face the mounting board.

In a surface acoustic wave device disclosed in Japanese Unexamined Patent Application Publication No. 2011-147097, a WLP structure is used to decrease the size and height. However, there exit needs to further decrease the size and height of the surface acoustic wave device.

Furthermore, the surface acoustic wave device disclosed in Japanese Unexamined Patent Application Publication No. 2011-147097 includes a pillar-shaped electrode electrically connected to an IDT electrode and a solder bump connected to the pillar-shaped electrode. The surface acoustic wave device is mounted on a land electrode of a mounting board through the solder bump. Thus, breaks may occur in a connecting portion between the solder bump and the land electrode and a connecting portion between the solder bump and the pillar-shaped electrode.

SUMMARY OF THE INVENTION

Preferred embodiments of the present invention provide surface acoustic wave devices with which the size and height is able to be decreased and mounting strength is able to be improved, high-frequency modules including the surface acoustic wave devices, and methods of fabricating the surface acoustic wave devices.

A surface acoustic wave device according to a preferred embodiment of the present invention includes a piezoelectric substrate, an IDT electrode, a support layer, a cover layer, and a pillar-shaped electrode. The IDT electrode is provided on one of main surfaces of the piezoelectric substrate and produces a surface acoustic wave. The support layer is disposed around a region on the one of the main surfaces where the IDT electrode is provided and has a larger height from the one of the main surfaces than a height of the IDT electrode from the one of the main surfaces. The cover layer is disposed on the support layer and covers the IDT electrode. The pillar-shaped electrode is provided at a position on the one of the main surfaces where the pillar-shaped electrode is in contact with the support layer and is electrically connected to the IDT electrode. An inner space is defined by the piezoelectric substrate, the support layer, and the cover layer. The pillar-shaped electrode includes a bottom surface that faces the one of the main surfaces, a top surface, and a side surface that connects the bottom surface and the top surface to each other. The top surface includes an exposed portion exposed to an outside and the side surface includes an exposed portion exposed to the outside.

With this structure, neither the support layer nor the cover layer is provided on the exposed portions of the pillar-shaped electrode. Thus, the size of the surface acoustic wave device is able to be decreased. Furthermore, no solder bump is provided on the pillar-shaped electrode. Thus, the height of the surface acoustic wave device is able to be decreased. Furthermore, when the surface acoustic wave device is mounted, the surface acoustic wave device is able to be connected to the mounting board or other structure through not only the top surface but also the side surface of the pillar-shaped electrode. Thus, mounting strength is improved.

Furthermore, an area of the exposed portion of the top surface may preferably be larger than an area of the exposed portion of the side surface.

With this structure, during the mounting of the surface acoustic wave device on the mounting board or other structure with a joining member, such as solder, the top surface is pulled close to the joining member with a larger force than a force with which the side surface is pulled close to the joining member. This reduces or prevents the occurrences of tombstone caused by the side surface being pulled with a larger force than a force with which the top surface is pulled.

Furthermore, the exposed portion of the side surface may preferably be continuous with the exposed portion of the top surface.

With this structure, during mounting of the surface acoustic wave device, when the joining member, such as solder, is applied to the exposed portion of the top surface and heated, the joining member is also applied to the exposed portion of the side surface through a portion where the exposed portion of the top surface and the exposed portion of the side surface are continued with each other due to wettability of the joining member. That is, during mounting, the joining member is applied by itself to the exposed portion of the side surface only by applying the joining member to the exposed portion of the top surface and heating the joining member. Thus, the surface acoustic wave device is able to be connected to the mounting board or other structure through not only the top surface but also the side surface of the pillar-shaped electrode. This improves mounting strength.

Furthermore, a connecting electrode made of a conductive material that is different from a material of the pillar-shaped electrode may preferably be provided on at least one of the exposed portion of the top surface and the exposed portion of the side surface.

With this structure, the mounting strength for mounting the surface acoustic wave device on the mounting board or other structure is improved by appropriately selecting the conductive material of the connecting electrode. That is, when a material that is strongly joined to both of the joining member, such as solder used for mounting and the material of the pillar-shaped electrode is selected as the material of the connecting electrode, the mounting strength of the surface acoustic wave device is improved. Furthermore, when the connecting electrode is provided, there is no need to consider the joining strength between the materials of the joining member and the pillar-shaped electrode. Accordingly, versatility in selecting these materials is improved.

Furthermore, a distance between the top surface of the pillar-shaped electrode and the one of the main surfaces may preferably be smaller than a distance between a main surface of the cover layer facing the outside and the one of the main surfaces.

With this structure, the top surface of the pillar-shaped electrode is able to be disposed at a lower position than the main surface of the cover layer. That is, a level difference between the main surface of the cover layer and the top surface of the pillar-shaped electrode may be provided. Thus, when the surface acoustic wave device is mounted on the mounting board or other structure, the joining member that connects the pillar-shaped electrode and the mounting board to each other is able to be disposed on the top surface of the pillar-shaped electrode. This reduces or prevents an increase in the mounting height of the surface acoustic wave device due to the height (thickness) of the joining member to the degree corresponding to the level difference. Accordingly, the height of a high-frequency module in which the surface acoustic wave device is mounted is able to be decreased.

Furthermore, a high-frequency module according to a preferred embodiment of the present invention includes a surface acoustic wave device according to a preferred embodiment of the present invention described above and a mounting board provided with a land electrode on which the surface acoustic wave device is mounted. The pillar-shaped electrode may preferably be connected to the land electrode through the exposed portion of the top surface and the exposed portion of the side surface.

With this structure, since the height of the surface acoustic wave device is decreased as described above, the height of the high-frequency module in which the surface acoustic wave device is mounted is able to be decreased. Furthermore, since the size of the surface acoustic wave device is decreased, the mounting area of the surface acoustic wave device is also decreased. Furthermore, the surface acoustic wave device is able to be connected to the mounting board or other structure through not only the top surface but also the side surface of the pillar-shaped electrode of the surface acoustic wave device. Thus, mounting strength is improved.

The cover layer may preferably be in contact with the mounting board.

With this structure, formation of a gap between the surface acoustic wave device and the mounting board is reduced, preferably to a minimum, and accordingly, the height of the high-frequency module is able to be further decreased. Furthermore, heat may be released from the surface acoustic wave device to the mounting board through a contact portion of the cover layer with the mounting board. Accordingly, even when large power is input to the IDT electrode of the surface acoustic wave device, an increase in temperature of the surface acoustic wave device is able to be reduced or prevented. Accordingly, changes in the characteristics of the surface acoustic wave device due to the increase in temperature are reduced or prevented.

Furthermore, a method of fabricating a surface acoustic wave device according to a preferred embodiment of the present invention includes a step of providing on one of main surfaces of a piezoelectric-substrate base material an IDT electrode that produces a surface acoustic wave, a step of providing a support layer that is disposed around a region on the one of the main surfaces where the IDT electrode is provided and that has a larger height from the one of the main surfaces than a height of the IDT electrode from the one of the main surfaces, a step of providing on the support layer a cover layer that covers the IDT electrode, a step of providing a pillar-shaped conductive member that is disposed on the one of the main surfaces, that is electrically connected to the IDT electrode, and that penetrates through the support layer and the cover layer, and a step of forming a pillar-shaped electrode by cutting the pillar-shaped conductive member in a direction intersecting the one of the main surfaces.

With this structure, the surface acoustic wave device that includes the pillar-shaped electrode the top surface and the side surface of which include the respective exposed portions exposed to the outside is able to be fabricated. That is, the surface acoustic wave device with which the size and height is decreased and the mounting strength is improved is able to be fabricated.

According to various preferred embodiments of the present invention, surface acoustic wave devices with which the size and height is decreased and the mounting strength is improved, high-frequency modules that include a surface acoustic wave device, and methods of fabricating surface acoustic wave devices are able to be provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 4A to 4H include sectional views illustrating the steps of fabricating the surface acoustic wave device according to the first preferred embodiment of the present invention.

DETAILED DESCRIPTION OF THE PREFERRED EMBODIMENTS

Figure 1:
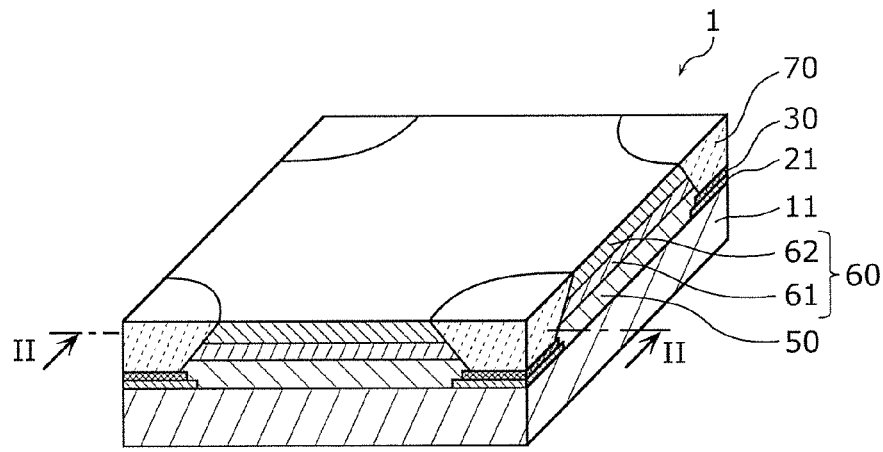
FIG. 1 is a perspective view of a surface acoustic wave device according to a first preferred embodiment of the present invention.

Preferred embodiments of the present invention will be described in detail below with reference to the drawings. It should be understood that all of the preferred embodiments described below are generic or specific examples. Values, shapes, materials, elements, arrangements of the elements, forms of connection, manufacturing steps, the orders of the manufacturing steps, and other features described in the following preferred embodiments are examples and not intended to limit the present invention. Of the elements in the following preferred embodiments, elements not described in the independent claims are described as arbitrary elements. Furthermore, sizes or the ratios of the sizes of the elements illustrated in the drawings are not necessarily exact.

First Preferred Embodiment

First, a surface acoustic wave device according to a first preferred embodiment of the present invention is described with reference to the drawings.

FIG. 1 is a perspective view of a surface acoustic wave device 1 according to the present preferred embodiment.

Figure 2:
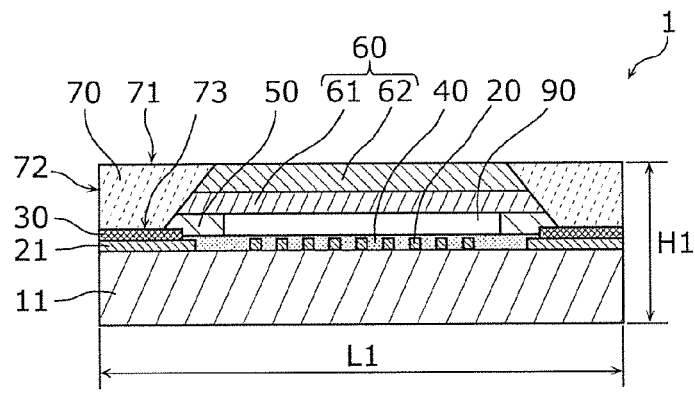
FIG. 2 is a sectional view of the surface acoustic wave device according to the first preferred embodiment of the present invention.

FIG. 2 is a sectional view of the surface acoustic wave device 1 according to the present preferred embodiment. FIG. 2 illustrates a section of the surface acoustic wave device 1 taken along line II-II illustrated in FIG. 1.

As illustrated in FIGS. 1 and 2, the surface acoustic wave device 1 according to the present preferred embodiment includes a piezoelectric substrate 11, IDT electrodes 20, terminal electrodes 21, wiring electrodes 30, a dielectric layer 40, a support layer 50, a cover layer 60, and pillar-shaped electrodes 70.

The piezoelectric substrate 11 includes main surfaces on one of which the IDT electrodes 20 that vibrate to produce surface acoustic waves are provided. Although the piezoelectric substrate 11 preferably has, as illustrated in FIG. 1, a rectangular or substantially rectangular shape in top view in which the length of the sides is about 1 mm according to the present preferred embodiment, the shape of the piezoelectric substrate 11 in top view is not limited to a rectangular or substantially rectangular shape and may have an arbitrary shape.

The piezoelectric substrate 11 is preferably made of, for example, piezoelectric single crystal, such as lithium tantalate ($LiTaO_3$), lithium niobate ($LiNbO_3$), quartz or piezoelectric ceramic.

The IDT electrodes 20 are comb-shaped electrodes provided on the one of the main surfaces of the piezoelectric substrate 11 and vibrate to produce surface acoustic waves. The IDT electrodes 20 are preferably made of a metal, such as Ti, Al, Cu, Au, Pt, Ag, Pd, or Ni, or an alloy of any of these metals, for example. Alternatively, the IDT electrodes 20 may include a plurality of multilayer bodies made of any of the above described metals or alloy.

The terminal electrodes 21 are connected to the IDT electrodes 20 and provided around the IDT electrodes 20. The terminal electrodes 21 are preferably made of a material that is the same as or similar to that of the IDT electrodes 20. Alternatively, as is the case with the IDT electrodes 20, the terminal electrodes 21 may include a plurality of multilayer bodies made of a metal or an alloy.

The wiring electrodes 30 are electrically connected to the IDT electrodes 20 and define portions of connecting paths that connect the IDT electrodes 20 to wiring outside the surface acoustic wave device 1. According to the present preferred embodiment, the wiring electrodes 30 are provided on the terminal electrodes 21. The wiring electrodes 30 are preferably made of a material that is the same as or similar to that of the IDT electrodes 20. Alternatively, as is the case with the IDT electrodes 20, the wiring electrodes 30 may include a plurality of multilayer bodies made of a metal or an alloy.

The dielectric layer 40 is a protective layer that covers the IDT electrodes 20. The dielectric layer 40 may also be used to improve the characteristics of the surface acoustic wave device 1. The dielectric layer 40 is provided on the piezoelectric substrate 11 so as to cover the IDT electrodes 20 and is preferably made of a dielectric such as, for example, silicon oxide or silicon nitride.

The support layer 50 is disposed around a region on the one of the main surfaces of the piezoelectric substrate 11 where the IDT electrodes 20 are provided. The height of the support layer 50 from the one of the main surfaces is larger than that of the IDT electrodes 20. The support layer 50 supports a surface of the cover layer 60 on the piezoelectric substrate 11 side in a state in which the cover layer 60 is separated from the IDT electrodes 20. Although the support layer 50 preferably has an elongated or substantially elongated annular shape in top view according to the present preferred embodiment, the shape of the support layer 50 is not limited to this. It is sufficient that the support layer 50 be shaped so as to be disposed around the region where the IDT electrodes 20 are provided and be able to support the cover layer 60. When the support layer 50 has an annular or substantially annular shape and surrounds the IDT electrodes 20, a space between the IDT electrodes 20 and the cover layer 60 is able to be liquid tightly sealed by the support layer 50 and the cover layer 60. That is, entrance of a liquid, such as water, into the space above the IDT electrodes 20 is able to be reduced or prevented.

The material of the support layer 50 is not particularly limited. The support layer 50 may preferably be made of, for example, a material that includes at least one of polyimide, epoxy, benzocyclobutene (BCB), polybenzoxazole (PBC)), metal, and silicon oxide.

The cover layer 60 is disposed on the support layer 50 and covers the IDT electrodes 20. According to the present preferred embodiment, the cover layer 60 is disposed at a position facing the main surface of the piezoelectric substrate 11 in which the IDT electrodes 20 are provided so as to be separated from the IDT electrodes 20. Thus, a gap 90 is provided between the IDT electrodes 20 (and the dielectric layer 40) and the cover layer 60 as illustrated in FIG. 2. Although the cover layer 60 preferably has a rectangular or substantially rectangular shape similar to the piezoelectric substrate 11 in top view as illustrated in FIG. 1 according to the present preferred embodiment, the shape of the cover layer 60 in top view is not limited to the rectangular or substantially rectangular shape and may be an arbitrary shape. Furthermore, the shapes of the cover layer 60 and the piezoelectric substrate 11 in top view may be different from each other.

According to the present preferred embodiment, the cover layer 60 includes a first layer 61 and a second layer 62. The first layer 61 connects the support layer 50 and the second layer 62 to each other. Although the material of the first layer 61 is not particularly limited, for example, the first layer 61 may preferably be made of a material that includes at least one of epoxy, urethane, phenol, polyester, BCB, and PBO. The second layer 62 is disposed on the first layer 61. Although the material of the second layer 62 is not particularly limited, it is preferable that the mechanical strength of the second layer 62, which is exposed to the outside of the surface acoustic wave device 1, be high. The second layer 62 may preferably be made of, for example, a material that includes at least one of polyimide, epoxy, BCB, PBO, silicon, silicon oxide, LiTaO$_3$, and LiNbO$_3$. Alternatively, the cover layer 60 may include a single layer.

The pillar-shaped electrodes 70 are disposed at positions on the one of the main surfaces of the piezoelectric substrate 11 where the pillar-shaped electrodes 70 are in contact with the support layer 50. The pillar-shaped electrodes 70 are electrically connected to the IDT electrodes 20. The pillar-shaped electrodes 70 define portions of connecting paths that connect the wiring electrodes 30 to the outside wiring. As illustrated in FIG. 2, the surface acoustic wave device 1 includes an inner space defined by the piezoelectric substrate 11, the support layer 50, and the cover layer 60. The pillar-shaped electrodes 70 each include a bottom surface 73 that faces the one of the main surfaces of the piezoelectric substrate 11, a top surface 71 that faces the bottom surface 73, and a side surface 72 that connects the bottom surface 73 to the top surface 71. The top surface 71 and the side surface 72 of the pillar-shaped electrode 70 include respective exposed portions exposed to the outside. Here, "outside" means an opposite space to the inner space with respect to the piezoelectric substrate 11, the support layer 50, and the cover layer 60 that define the inner space. That is, "outside" means a space outside of the surface acoustic wave device 1. The surface acoustic wave device 1 is mounted on a mounting board through the exposed portions. As illustrated in FIG. 2, in some cases, an end portion of the wiring electrodes 30 and an end portion of the IDT electrodes 20 are exposed to the outside in a state in which the side surface 72, the end portion of the wiring electrodes 30, and the end portion of the IDT electrodes 20 are continuously disposed. In this case, the surface acoustic wave device 1 may be mounted on the mounting board through these end portions.

Furthermore, during mounting of the surface acoustic wave device 1 with a joining member, such as solder, the exposed portions of the top surface 71 and the side surface 72 are pulled close to the joining member due to surface tension or other related forces of the joining member. Accordingly, it is preferable in the surface acoustic wave device 1 that the area of the exposed portion of the top surface 71 be larger than the area of the exposed portion of the side surface 72. With this structure, during the mounting of the surface acoustic wave device 1 on the mounting board or other structure with the joining member, the top surface 71 is pulled close to the joining member with a larger force than a force with which the side surface 72 is pulled close to the joining member. This reduces or prevents the occurrences of tombstone caused by the side surface 72 being pulled with a larger force than a force with which the top surface 71 is pulled.

It is also preferable in the surface acoustic wave device 1 that the exposed portion of the side surface 72 be continuous with the exposed portion of the top surface 71. With this structure, during mounting of the surface acoustic wave device 1, when the joining member, such as solder, is applied to the exposed portion of the top surface 71 and heated, the joining member is also applied to the exposed portion of the side surface 72 through a portion where the exposed portion of the top surface 71 and the exposed portion of the side surface 72 are continuous with each other due to wettability of the joining member. That is, during mounting, the joining member is applied by itself to the exposed portion of the side surface 72 only by applying the joining member to the exposed portion of the top surface 71 and heating the joining member.

Next, for understanding the advantageous effects of the surface acoustic wave device 1 according to the present preferred embodiment, the surface acoustic wave device 1 according to the present preferred embodiment is compared to a surface acoustic wave device of a comparative example.

Figure 3:
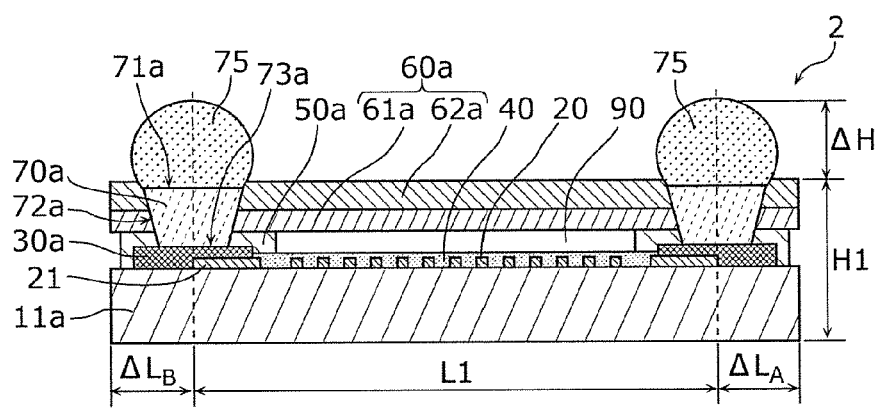
FIG. 3 is a sectional view of a surface acoustic wave device according to a comparative example.

FIG. 3 is a sectional view of a surface acoustic wave device 2 according to a comparative example.

As illustrated in FIG. 3, as is the case with the surface acoustic wave device 1 according to the present preferred embodiment, the surface acoustic wave device 2 according to the comparative example includes a piezoelectric substrate 11a, the IDT electrodes 20, the terminal electrodes 21, wiring electrodes 30a, the dielectric layer 40, a support layer 50a, a cover layer 60a, and pillar-shaped electrodes 70a. As is the case with the cover layer 60 according to the present preferred embodiment, the cover layer 60a includes a first layer 61a and a second layer 62a. The surface acoustic wave device 2 according to the comparative example further includes solder bumps 75.

The pillar-shaped electrodes 70a according to the comparative example each include a bottom surface 73a that faces one of main surfaces of the piezoelectric substrate 11a, a top surface 71a that faces the bottom surface 73a, and a side surface 72a that connects the bottom surface 73a to the top surface 71a. The pillar-shaped electrodes 70a are different from the pillar-shaped electrodes 70 according to the present preferred embodiment in the following points: the side surfaces 72a are not exposed to the outside; and the solder bumps 75 are provided on the top surfaces 71a.

As illustrated in FIG. 3, the entirety of the side surface 72a of each of the pillar-shaped electrodes 70a is covered with the support layer 50a and the cover layer 60a. Thus, the support layer 50a and the cover layer 60a are also provided outside the pillar-shaped electrodes 70a in the surface acoustic wave device 2 according to the comparative example. In contrast, as illustrated in FIG. 2, the side surfaces 72 of the pillar-shaped electrodes 70 include the exposed portions exposed to the outside, and accordingly, neither the support layer 50 nor the cover layer is disposed outside the pillar-shaped electrodes 70 in the surface acoustic wave device 1 according to the present preferred embodiment. Accordingly, a dimension L1 in the lateral direction of the surface acoustic wave device 1 according to the present preferred embodiment illustrated in FIG. 2 is smaller than a dimension L1+$\Delta L_A$+$\Delta L_B$ in the lateral direction of the surface acoustic wave device 2 according to the comparative example illustrated in FIG. 3. Here, the difference $\Delta L_A$+$\Delta L_B$ in dimension between the surface acoustic wave device 1 and the surface acoustic wave device 2 in the lateral direction is the length that is a dimension of the support layer 50a that is disposed outside the pillar-shaped electrodes 70a.

Furthermore, the solder bumps 75 are provided on the top surfaces 71a of the pillar-shaped electrodes 70a. In contrast, no solder bump is provided in the surface acoustic wave device 1 according to the present preferred embodiment. Accordingly, a height H1 of the surface acoustic wave device 1 according to the present preferred embodiment illustrated in FIG. 2 is smaller than a height H1+ΔH of the surface acoustic wave device 2 according to the comparative example illustrated in FIG. 3 by the height ΔH of the solder bumps 75. In the surface acoustic wave device, the height of the solder bumps is, for example, from about 60 μm to about 100 μm. Thus, the height of the surface acoustic wave device according to the present preferred embodiment is able to be decreased from that of the surface acoustic wave device using the solder bumps by, for example, about 60 μm to about 100 μm.

As has been described, with the surface acoustic wave device 1 according to the present preferred embodiment, the size and the height are decreased.

Furthermore, the surface acoustic wave device 1 according to the present preferred embodiment is mounted on the mounting board or other structure through two surfaces, that is, the exposed portion of the top surface 71 and the exposed portion of the side surface 72 of each of the pillar-shaped electrodes 70. In contrast, the surface acoustic wave device 2 according to the comparative example is mounted on the mounting board or other structure only through a top portion of each of the solder bumps illustrated in FIG. 3. Accordingly, with the surface acoustic wave device 1 according to the present preferred embodiment, mounting strength is improved as compared to the case where the surface acoustic wave device 2 according to the comparative example is used.

Next, a method of fabricating the surface acoustic wave device 1 according to the present preferred embodiment is described with reference to the drawings.

FIGS. 4A to 4H include sectional views illustrating the steps of fabricating the surface acoustic wave device 1 according to the present preferred embodiment.

First, as illustrated in sectional view in FIG. 4A, the IDT electrodes 20 that vibrate to produce surface acoustic waves and the terminal electrodes 21 are formed on the one of the main surfaces of a piezoelectric-substrate base material 10. According to the present preferred embodiment, a resist pattern is formed on the one of the main surfaces of the piezoelectric-substrate base material 10 by photolithography. Conductive films are deposited on the piezoelectric-substrate base material 10 on which the resist pattern has been formed by vacuum deposition. After that, the IDT electrodes 20 and the terminal electrodes 21 are formed by removing the resist pattern. The piezoelectric-substrate base material 10 is a base material of the piezoelectric substrate 11 included in the surface acoustic wave device 1. Although the thickness of the piezoelectric-substrate base material 10 is not particularly limited, according to the present preferred embodiment, the piezoelectric-substrate base material 10 preferably has a thickness of from about 100 μm to about 150 μm, for example. The piezoelectric-substrate base material 10 is preferably, for example, a 42° Y cut LiTaO$_3$ substrate. As the conductive films forming the IDT electrodes 20 and the terminal electrodes 21, from the piezoelectric-substrate base material 10 side, a Ti film and an AlCu film are preferably formed by vacuum deposition. As the AlCu film, for example, an Al alloy film containing 1% Cu may be used. Furthermore, the terminal electrodes 21 may be formed at the same time as the IDT electrodes 20 or may be formed separately from the IDT electrodes 20.

Next, as illustrated in sectional view in FIG. 4B, the wiring electrodes 30 electrically connected to the IDT electrodes 20 are formed on the one of the main surfaces of a piezoelectric-substrate base material 10. According to the present preferred embodiment, a resist pattern is formed on the one of the main surfaces of the piezoelectric-substrate base material 10 by photolithography. Conductive films are deposited on the piezoelectric-substrate base material 10 on which the resist pattern has been formed by vacuum deposition. After that, the wiring electrodes 30 are formed by removing the resist pattern. As the conductive films forming the wiring electrodes 30, from the piezoelectric-substrate base material 10 side, a Ti film, a Pt film, and a Ti film are preferably formed by vacuum deposition.

Next, as illustrated in sectional view in FIG. 4C, the dielectric layer 40 that covers the IDT electrodes 20 is deposited on the piezoelectric-substrate base material 10. According to the present preferred embodiment, as the dielectric layer 40, for example, an SiO$_2$ film is preferably deposited on the entirety of the piezoelectric-substrate base material 10 by sputtering or other suitable method. Next, a resist pattern is formed in a region where the IDT electrodes 20 has been formed, and a portion of the SiO$_2$ film in a region where the resist is not formed is removed by etching with CF$_4$ plasma or other suitable method. Next, the resist pattern is removed.

Next, as illustrated in sectional view in FIG. 4D, the support layer 50, the height of which from the one of the main surfaces of the piezoelectric-substrate base material 10 is larger than that of the IDT electrodes 20, is disposed around the region where the IDT electrodes 20 are provided on the one of the main surfaces of the piezoelectric-substrate base material 10. According to the present preferred embodiment, the support layer 50 is preferably formed of polyimide, for example. Regarding the support layer 50, for example, photosensitive polyimide may be deposited on the piezoelectric-substrate base material 10, and the pattern of the support layer 50 is formed by photolithography. The thickness of the support layer 50 is preferably, for example, from about 10 μm to about 15 μm. As illustrated in sectional view in FIG. 4D, the support layer 50 is formed on the wiring electrodes 30.

Next, as illustrated in sectional view in FIG. 4E, the cover layer 60 that covers the IDT electrodes 20 is provided on the support layer 50. According to the present preferred embodiment, as the cover layer 60, a sheet-shaped combined material that preferably includes two layers, that is, the first layer 61 and the second layer 62 laminated in advance is pasted and pressure bonded. However, the present preferred embodiment is not limited to the cover layer that includes two layers, and may include a cover layer that includes a single layer. The first layer 61 is preferably formed of, for example, epoxy. The second layer 62 is preferably formed of, for example, polyimide. The first layer 61 is joined to the second layer 62.

Next, as illustrated in sectional view in FIG. 4F, through holes 70h for forming the pillar-shaped electrodes 70 are formed. According to the present preferred embodiment, a laser is radiated from the cover layer 60 side to a region where the cover layer 60, the support layer 50, and the wiring electrodes 30 are superposed on one another. In this manner, the cover layer 60 and the support layer 50 are partially removed, such that the through holes 70h are formed and the wiring electrodes 30 are exposed on the cover layer 60 side.

Next, as illustrated in sectional view in FIG. 4G, pillar-shaped conductive members 70g are formed in the through holes 70h. According to the present preferred embodiment, first, the region other than the through holes 70h are covered with a resist pattern. Next, Ni electrolytic plating is performed so as to grow the pillar-shaped conductive members 70g in the region not covered by the resist pattern (that is, the above-described region removed by the laser). Next, the resist pattern is removed.

Next, as illustrated in sectional view in FIG. 4H, the pillar-shaped electrodes 70 are formed by cutting the pillar-shaped conductive members 70g in a direction intersecting the one of the main surfaces of a piezoelectric-substrate base material 10. According to the present preferred embodiment, the pillar-shaped conductive members 70g, the piezoelectric-substrate base material 10, and other structures are cut with a dicer perpendicular or substantially perpendicular to the one of the main surfaces of the piezoelectric-substrate base material 10. When cutting with the dicer, portions of the piezoelectric-substrate base material 10 and the members on the main surface of the piezoelectric-substrate base material 10 are removed by a width corresponding to cutting margins D1 for the dicer. Accordingly, it is required that the dimension of the pillar-shaped conductive members 70g on the piezoelectric-substrate base material 10 be determined with the cutting margins D1 considered.

As has been described, the surface acoustic wave device 1 according to the present preferred embodiment that includes the pillar-shaped electrodes 70, the piezoelectric substrate 11, and other structures is fabricated.

In the example described in the above-described fabricating method, the pillar-shaped conductive members 70g are formed for each of the surface acoustic wave device 1. However, the method of forming the pillar-shaped conductive members 70g is not limited to this. For example, a method in which the pillar-shaped conductive members 70g are shared between a plurality of adjacent surface acoustic wave devices 1 may be used. This method is described with reference to the drawings.

Figure 5A:
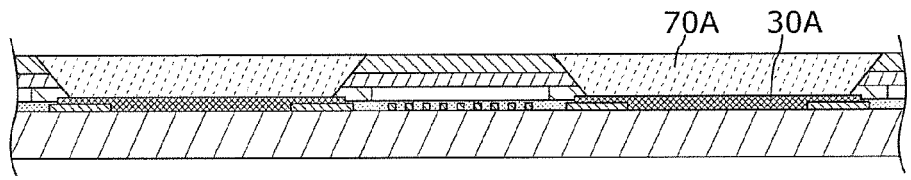
FIGS. 5A and 5B include sectional views illustrating the steps of fabricating the surface acoustic wave device according to the first preferred embodiment of the present invention.
Figure 5B:
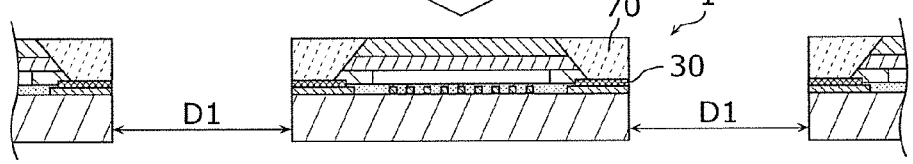

FIGS. 5A and 5B include sectional views illustrating the steps of fabricating the surface acoustic wave device 1 according to the present preferred embodiment.

As illustrated in sectional view in FIG. 5A, pillar-shaped conductive members 70A and wiring conductive members 30A shared among a plurality of adjacent surface acoustic wave devices 1 may be formed.

Also in the case where such pillar-shaped conductive members 70A are formed, the surface acoustic wave device 1 that includes the pillar-shaped electrodes 70 and the wiring electrodes may be fabricated by performing cutting with a dicer as illustrated in sectional view in FIG. 5B.

With the fabricating method illustrated in FIGS. 5A and 5B, the number of pillar-shaped conductive members 70A is able to be decreased, and accordingly, fabricating steps are simplified.

Although the piezoelectric-substrate base material 10 and the pillar-shaped conductive members 70g are preferably cut at the same time in the above-described fabricating method, the method of fabricating the surface acoustic wave device 1 is not limited to this. For example, the piezoelectric-substrate base material 10 may be cut after the pillar-shaped conductive members 70g have been cut in a direction intersecting the one of the main surfaces of the piezoelectric-substrate base material 10.

Second Preferred Embodiment

Next, a high-frequency module according to a second preferred embodiment of the present invention is described. In the high-frequency module according to the present preferred embodiment, the surface acoustic wave device 1 according to the first preferred embodiment is mounted on a mounting board. The high-frequency module according to the present preferred embodiment will be described below with reference to the drawings.

Figure 6:
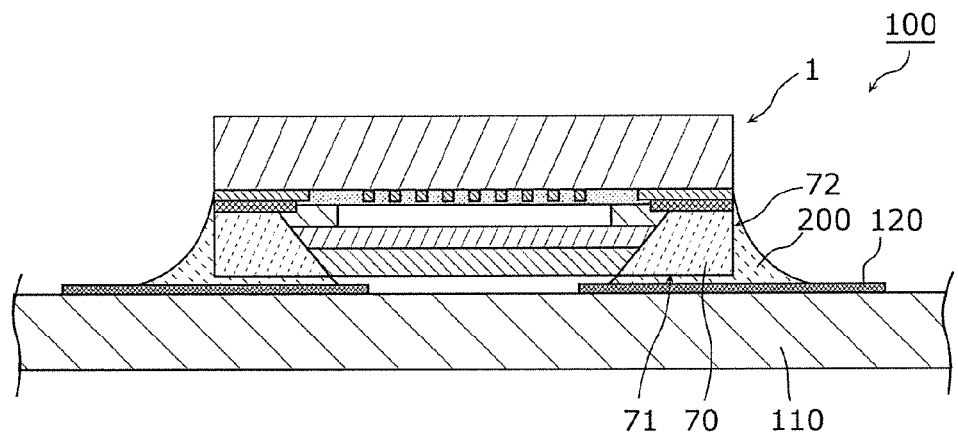
FIG. 6 is a sectional view illustrating the structure of a high-frequency module according to a second preferred embodiment of the present invention.

FIG. 6 is a sectional view illustrating the structure of a high-frequency module 100 according to the present preferred embodiment.

As illustrated in FIG. 6, the high-frequency module 100 includes the surface acoustic wave device 1 according to the above-described first preferred embodiment, a mounting board 110, and a joining member 200.

The mounting board 110 includes land electrodes 120 disposed on one of main surfaces thereof. In addition to the surface acoustic wave device 1, other electronic devices (not illustrated) are mounted on the mounting board 110. The material of the mounting board 110 is not particularly limited. The mounting board 110 is preferably, for example, a printed board in which land electrodes 120 and other elements are printed on a ceramic multi-layer board, a glass epoxy board, or other suitable board.

The surface acoustic wave device 1 is mounted on the land electrodes 120. The pillar-shaped electrodes 70 of the surface acoustic wave device 1 are connected to the land electrodes 120. In more detail, the pillar-shaped electrodes 70 are connected to the land electrodes 120 through the exposed portions of the top surfaces 71 and the side surfaces 72 thereof. As illustrated in FIG. 6, the pillar-shaped electrodes 70 and the land electrodes 120 are connected by the joining member 200.

The joining member 200 joins the pillar-shaped electrodes 70 and the land electrodes 120 to each other. The material of the joining member 200 is not particularly limited. The joining member 200 may preferably be, for example, solder or a conductive adhesive.

As illustrated in FIG. 6, the pillar-shaped electrodes 70 are connected to the land electrodes 120 at the exposed portions of the top surfaces 71 through the joining member 200 and connected to the land electrodes 120 at the exposed portions of the side surfaces 72 through the fillet-shaped joining member 200. The fillet-shaped joining member 200 is preferably formed by itself as follows: for example, in a reflow step, the joining member 200 that includes solder or other suitable joining material is heated so as to be fused, and then, cooled so as to be solidified while the surface acoustic wave device 1 is disposed on the mounting board 110.

As described above, in the high-frequency module 100, the surface acoustic wave device 1 is connected to the land electrodes 120 of the mounting board 110 by the joining member 200 through the exposed portions of the top surfaces 71 and the exposed portions of the side surfaces 72 of the pillar-shaped electrodes 70. Thus, mounting strength is improved as compared to the case where the surface acoustic wave device 1 is mounted on a mounting board or other suitable board through solder bumps.

Furthermore, since the surface acoustic wave device 1 does not include solder bumps, the height of the high-frequency module 100 is able to be decreased as compared to the case where the surface acoustic wave device 2 according to the comparative example is used.

Furthermore, in the high-frequency module 100, the size of the surface acoustic wave device 1 is decreased as described in the first preferred embodiment. Accordingly, the mounting area of the surface acoustic wave device 1 is decreased in the high-frequency module 100.

Third Preferred Embodiment

Next, a surface acoustic wave device according to a third preferred embodiment of the present invention is described. The surface acoustic wave device according to the present preferred embodiment is different from the surface acoustic wave device 1 according to the above-described first preferred embodiment in the following point: in order to further improve the mounting strength, connecting electrodes made of a conductive material that is different from the material of the pillar-shaped electrodes are preferably provided on the exposed portions of the pillar-shaped electrodes. The surface acoustic wave device according to the present preferred embodiment will be described below with reference to the drawings by focusing on the difference between the surface acoustic wave device according to the present preferred embodiment and the surface acoustic wave device 1 according to the first preferred embodiment.

Figure 7:
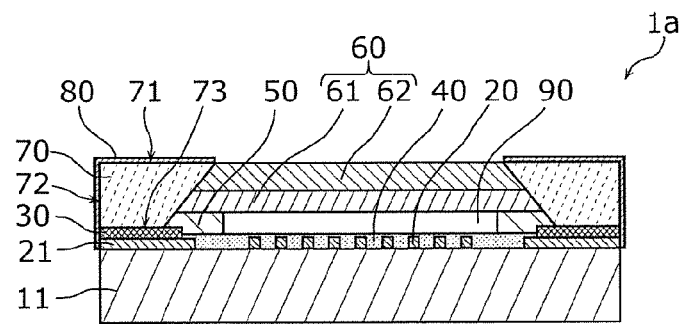
FIG. 7 is a sectional view of a surface acoustic wave device according to a third preferred embodiment of the present invention.

FIG. 7 is a sectional view of a surface acoustic wave device 1a according to the present preferred embodiment.

As illustrated in FIG. 7, the surface acoustic wave device 1a according to the present preferred embodiment includes connecting electrodes 80 in addition to the surface acoustic wave device 1 according to the above-described preferred embodiment.

The connecting electrodes 80 are preferably provided on the exposed portions of the top surfaces 71 and the exposed portions of the side surfaces 72 of the pillar-shaped electrodes 70 and made of a conductive material that is different from the material of the pillar-shaped electrodes 70. As the conductive material included in the connecting electrodes 80, a joining member, such as solder, used when the surface acoustic wave device 1a is mounted on the mounting board or other suitable board or a material exhibiting a high joining strength with the material of the pillar-shaped electrodes 70 may preferably be selected. Thus, the joining strength between the pillar-shaped electrodes 70 and the joining member is improved as compared to the case where the pillar-shaped electrodes 70 are directly joined to the joining member, such as solder. Accordingly, the mounting strength of the surface acoustic wave device 1a is improved.

The conductive material included in the connecting electrodes 80 is appropriately selected in accordance with the material of the pillar-shaped electrodes 70 and the material of the joining member used when the surface acoustic wave device 1a is mounted on the mounting board or other suitable board. For example, when the joining member is made of solder and the pillar-shaped electrodes 70 is made of Ni, it is sufficient that Au, Ag, or other suitable material be selected as the connecting electrodes 80. The method of forming the connecting electrodes 80 is not particularly limited. For example, the connecting electrodes 80 may preferably be formed on the exposed portions of the pillar-shaped electrodes 70 by, for example, electrolytic plating. Furthermore, although the thickness of the connecting electrodes 80 is not particularly limited, it is preferable that the thickness of the connecting electrodes 80 be decreased in order to decrease the height of the surface acoustic wave device 1a. For example, it is preferable that the thickness of the connecting electrodes 80 be from about 0.1 μm to about 1 μm.

The connecting electrodes 80 are not necessarily provided on both of the exposed portions of the top surfaces 71 and the exposed portions of the side surfaces 72. For example, the connecting electrodes 80 may be provided only on the exposed portions of the top surfaces 71 or the exposed portions of the side surfaces 72 or on both the exposed portions of the top surfaces 71 and the exposed portions of the side surfaces 72. Furthermore, the connecting electrodes 80 are not necessarily provided over the entirety of the exposed portions of the top surfaces 71 and the entirety of the exposed portions of the side surfaces 72. For example, the connecting electrodes 80 may be provided on at least portions of the exposed portions of the top surfaces 71 and of the exposed portions of the side surfaces 72.

As has been described, in the surface acoustic wave device 1a according to the present preferred embodiment, the connecting electrodes 80 that are made of a conductive material that is different from the material of the pillar-shaped electrodes are preferably provided on the exposed portions of the top surfaces 71 and the exposed portions of the side surfaces 72 of the pillar-shaped electrodes 70.

When the connecting electrodes 80 are provided as described above, the mounting strength for mounting the surface acoustic wave device 1a on the mounting board or other suitable board is able to be improved by appropriately selecting the conductive material of the connecting electrodes 80. That is, when a material that is strongly joined to both of the joining member, such as solder, used for mounting and the material of the pillar-shaped electrodes 70 is selected as the material of the connecting electrodes 80, the mounting strength of the surface acoustic wave device 1a is able to be improved. Furthermore, when the connecting electrodes 80 are provided, there is no need of considering the joining strength between the materials of the joining member and the pillar-shaped electrodes. Accordingly, versatility in selecting these materials is improved.

When the wiring electrodes 30 and the terminal electrodes 21 are exposed to the outside in a state in which the side surfaces 72 of the pillar-shaped electrodes 70, the wiring electrodes 30, and the terminal electrodes 21 are continuously disposed as illustrated in FIG. 7, the connecting electrodes 80 may preferably also be provided on the exposed portions of the wiring electrodes 30 and the terminal electrodes 21. This increases the surface area of the connecting electrodes 80, and accordingly, the mounting strength by which the surface acoustic wave device 1a is mounted on the mounting board or other suitable board is improved. Furthermore, to allow the mounting strength to be further improved, the material of the connecting electrodes 80 may preferably be selected by considering the material of the wiring electrodes 30 and the terminal electrodes 21.

Fourth Preferred Embodiment

Next, a surface acoustic wave device according to a fourth preferred embodiment of the present invention and a high-frequency module on which the surface acoustic wave device according to the fourth preferred embodiment is mounted are described. In the surface acoustic wave device according to the present preferred embodiment, in order to achieve a further decrease in height and improvement of heat release characteristics, the distance between the top surfaces of the pillar-shaped electrodes and the main surface of the piezoelectric substrate is preferably smaller than the distance between an externally facing main surface of the cover layer and the main surface of the piezoelectric substrate. The surface acoustic wave device according to the present preferred embodiment and the high-frequency module on which the surface acoustic wave device according to the present preferred embodiment is mounted are described below with reference to the drawings.

Figure 8:
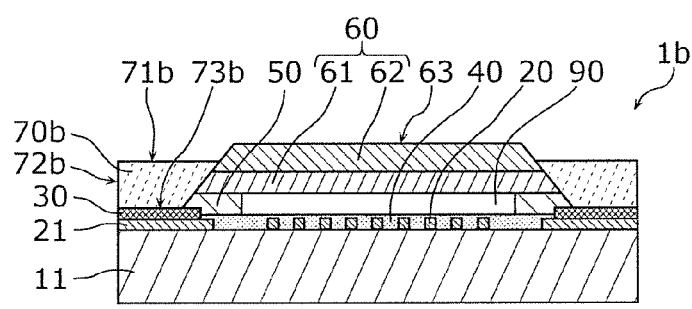
FIG. 8 is a sectional view of a surface acoustic wave device according to a fourth preferred embodiment of the present invention.

FIG. 8 is a sectional view of a surface acoustic wave device 1b according to the present preferred embodiment.

Figure 9:
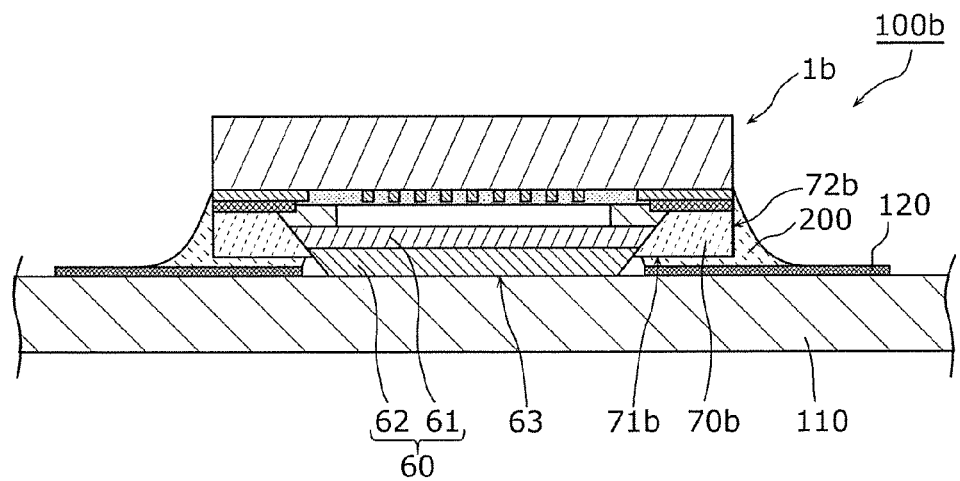
FIG. 9 is a sectional view illustrating the structure of a high-frequency module on which a surface acoustic wave device according to the fourth preferred embodiment of the present invention is mounted.

FIG. 9 is a sectional view illustrating the structure of a high-frequency module 100b on which the surface acoustic wave device 1b according to the present preferred embodiment is mounted. As illustrated in FIG. 9, as is the case with the high-frequency module 100 according to the second preferred embodiment, the high-frequency module 100b according to the present preferred embodiment includes the surface acoustic wave device 1b, the mounting board 110, and the joining member 200.

As illustrated in FIG. 8, the structure of pillar-shaped electrodes 70b of the surface acoustic wave device 1b according to the present preferred embodiment is different from that of the surface acoustic wave device 1 according to the above-described first preferred embodiment. As is the case with the pillar-shaped electrodes 70 according to the first preferred embodiment, the pillar-shaped electrodes 70b according to the present preferred embodiment each include a bottom surface 73b, a top surface 71b facing the bottom surface 73b, and a side surface 72b connecting the top surface 71b and the bottom surface 73b to each other. However, the distance between the top surfaces 71b and the main surface of the piezoelectric substrate 11 is preferably smaller than the distance between an externally facing main surface 63 of the cover layer 60 and the piezoelectric substrate 11. With such a structure, the top surfaces 71b of the pillar-shaped electrodes 70b is able to be disposed at a lower position than the main surface 63 of the cover layer 60. That is, a level difference between the main surface 63 of the cover layer 60 and the top surfaces 71b of the pillar-shaped electrodes 70b is able to be provided.

Thus, as illustrated in FIG. 9, when the surface acoustic wave device 1b is mounted on the mounting board 110, the joining member 200 that connects the pillar-shaped electrodes 70b and the mounting board 110 to one another is able to be disposed in portions of the top surfaces 71b the level of which is different from the level of the main surface 63. This reduces or prevents an increase in the mounting height of the surface acoustic wave device 1b due to the height (thickness) of the joining member 200 to the extent corresponding to the level difference. Accordingly, with the high-frequency module 100b, the height is able to be lower than that of the high-frequency module 100 according to the second preferred embodiment.

As described above, the height of the surface acoustic wave device 1b itself according to the present preferred embodiment is preferably equal or substantially equal to that of the surface acoustic wave device 1 according to the first preferred embodiment. However, the height of the high-frequency module 100b on which the surface acoustic wave device 1b is mounted is able to be lower than that of the high-frequency module 100 according to the second preferred embodiment.

Furthermore, as illustrated in FIG. 9, when the surface acoustic wave device 1b according to the present preferred embodiment is used, the externally facing main surface 63 of the cover layer 60 of the surface acoustic wave device 1b is able to be in contact with the mounting board 110.

This reduces or prevents formation of a gap between the surface acoustic wave device 1b and the mounting board 110 to a minimum, and accordingly, the height of the high-frequency module 100b is able to be further decreased. Furthermore, with the above-described structure, heat is able to be released from the surface acoustic wave device 1b to the mounting board 110 through the main surface 63 of the cover layer 60. Accordingly, even when large power is input to the IDT electrodes 20 of the surface acoustic wave device 1b, an increase in temperature of the surface acoustic wave device 1b is able to be reduced or prevented. Accordingly, changes in characteristics of the surface acoustic wave device 1b due to the increase in temperature are able to be reduced or prevented.

Although the surface acoustic wave devices according to the preferred embodiments of the present invention has been described, the present invention is not limited to the preferred embodiments. For example, the present invention can include structures in which the following variations are made to the above-described preferred embodiments.

For example, the present invention may include structures provided by arbitrarily combining characteristic features and elements of the preferred embodiments and variations of the preferred embodiments. For example, the connecting electrodes 80 according to the third preferred embodiment may be provided in the surface acoustic wave device 1b according to the fourth preferred embodiment.

Furthermore, as illustrated in FIG. 1, in the surface acoustic wave devices according to the preferred embodiments, the side surface of each of the pillar-shaped electrode includes the exposed portion extending on two sides that are perpendicular or substantially perpendicular to each other. However, the exposed portion of the side surface may extend only on a single side.

Furthermore, in the above-described preferred embodiments, all of the pillar-shaped electrodes preferably include their respective exposed portions. Instead, only some of the pillar-shaped electrodes include the exposed portions.

Furthermore, in the surface acoustic wave devices according to the above-described preferred embodiments, the dielectric layer 40 that covers the IDT electrodes 20 and the wiring electrodes 30 is preferably provided. However, the dielectric layer 40 is not necessarily provided.

Furthermore, according to the fourth preferred embodiment, the top surfaces 71b of the pillar-shaped electrodes 70b are preferably disposed at a lower position than the position of the main surface 63 of the cover layer 60, such that the main surface 63 of the cover layer 60 is in contact with the mounting board 110. However, a structure in which the main surface 63 of the cover layer 60 is in contact with the mounting board 110 is not limited to this. Alternatively, the cover layer 60 may be in contact with the mounting board by using the surface acoustic wave device 1 according to the first preferred embodiment. For example, in order to make the cover layer 60 of the surface acoustic wave device 1 be in contact with the mounting board, a projection may be provided on the mounting board.

Surface acoustic wave devices according to preferred embodiments of the present invention which have a small size and a small height and exhibit high mounting strength may be widely used for communication devices such as cellular phones.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A surface acoustic wave device comprising:
a piezoelectric substrate;

an IDT electrode provided on one of main surfaces of the piezoelectric substrate and that vibrates to produce a surface acoustic wave;
a support layer disposed around a region on the one of the main surfaces where the IDT electrode is provided and having a larger height from the one of the main surfaces than a height of the IDT electrode from the one of the main surfaces;
a cover layer disposed on the support layer and covering the IDT electrode; and
a pillar-shaped electrode disposed at a position on the one of the main surfaces where the pillar-shaped electrode is in contact with the support layer and electrically connected to the IDT electrode; wherein
an inner space is defined by the piezoelectric substrate, the support layer, and the cover layer;
the pillar-shaped electrode includes:
    a bottom surface that faces the one of the main surfaces;
    a top surface; and
    at least one side surface that connects the bottom surface and the top surface to each other; wherein
the top surface includes an exposed portion exposed to an outside;
the at least one side surface includes an exposed portion exposed to the outside; and
the at least one side surface includes a portion that is in contact with the support layer and is opposed to the exposed portion of the at least one side surface in a direction that is perpendicular or substantially perpendicular to a direction in which the height of the support layer extends.

2. The surface acoustic wave device according to claim 1, wherein an area of the exposed portion of the top surface is larger than an area of the exposed portion of the at least one side surface.

3. The surface acoustic wave device according to claim 1, wherein the exposed portion of the at least one side surface is continuous with the exposed portion of the top surface.

4. The surface acoustic wave device according to claim 1, wherein a connecting electrode made of a conductive material that is different from a material of the pillar-shaped electrode is provided on at least one of the exposed portion of the top surface and the exposed portion of the at least one side surface.

5. The surface acoustic wave device according to claim 1, wherein a distance between the top surface of the pillar-shaped electrode and the one of the main surfaces is smaller than a distance between a main surface of the cover layer facing the outside and the one of the main surfaces.

6. A high-frequency module comprising:
    the surface acoustic wave device according to claim 1; and
    a mounting board including a land electrode on which the surface acoustic wave device is mounted; wherein
    the pillar-shaped electrode is connected to the land electrode through the exposed portion of the top surface and the exposed portion of the at least one side surface.

7. The high-frequency module according to claim 6, wherein the cover layer is in contact with the mounting board.

8. The high-frequency module according to claim 6, wherein an area of the exposed portion of the top surface is larger than an area of the exposed portion of the at least one side surface.

9. The high-frequency module according to claim 6, wherein the exposed portion of the at least one side surface is continuous with the exposed portion of the top surface.

10. The high-frequency module according to claim 6, wherein a connecting electrode made of a conductive material that is different from a material of the pillar-shaped electrode is provided on at least one of the exposed portion of the top surface and the exposed portion of the at least one side surface.

11. The high-frequency module according to claim 6, wherein a distance between the top surface of the pillar-shaped electrode and the one of the main surfaces is smaller than a distance between a main surface of the cover layer facing the outside and the one of the main surfaces.

* * * * *